(12) United States Patent
Krabbenborg

(10) Patent No.: US 9,641,081 B2
(45) Date of Patent: May 2, 2017

(54) BOOST CONVERTER

(71) Applicant: NXP B.V., Eindhoven (NL)

(72) Inventor: Benno Krabbenborg, Arnhem (NL)

(73) Assignee: NXP B.V., Eindhoven (NL)

( * ) Notice: Subject to any disclaimer, the term of this patent is extended or adjusted under 35 U.S.C. 154(b) by 39 days.

(21) Appl. No.: 14/191,231

(22) Filed: Feb. 26, 2014

(65) Prior Publication Data

US 2014/0247029 A1 Sep. 4, 2014

(30) Foreign Application Priority Data

Mar. 4, 2013 (EP) ..................................... 13157534

(51) Int. Cl.
| | | |
|---|---|---|
| *H02M 3/156* | (2006.01) | |
| *H02M 3/158* | (2006.01) | |
| *H02M 1/00* | (2006.01) | |

(52) U.S. Cl.
CPC ......... *H02M 3/1588* (2013.01); *H02M 3/156* (2013.01); *H02M 2001/0025* (2013.01)

(58) Field of Classification Search
CPC ......... H02M 3/156; H02M 2003/1588; H02M 3/158; H02M 3/1582
USPC ........................................ 323/282, 285, 222
See application file for complete search history.

(56) References Cited

U.S. PATENT DOCUMENTS

| | | | | |
|---|---|---|---|---|
| 5,111,133 A | * | 5/1992 | Poulo | H02M 3/1588 |
| | | | | 323/286 |
| 7,733,671 B2 | * | 6/2010 | Chen | H02M 3/158 |
| | | | | 323/222 |
| 2006/0284607 A1 | | 12/2006 | Isobe | |
| 2007/0252567 A1 | * | 11/2007 | Dearn | H02M 3/156 |
| | | | | 323/282 |
| 2007/0296389 A1 | | 12/2007 | Chen et al. | |
| 2008/0169796 A1 | * | 7/2008 | Buethker | H02M 3/1582 |
| | | | | 323/282 |

(Continued)

FOREIGN PATENT DOCUMENTS

CN 101093958 A 12/2007

OTHER PUBLICATIONS

Grote T. et al. "Adaptive Digital Slope Compensation for Peak Current Mode Control", IEEE Energy Conversion Congress and Exposition, pp. 3523-3529 (Sep. 2009).

(Continued)

*Primary Examiner* — Fred E Finch, III
*Assistant Examiner* — Sisay G Tiku
(74) *Attorney, Agent, or Firm* — Rajeev Madnawat

(57) ABSTRACT

A boost converter for converting between an input voltage and an output voltage is disclosed. The boost converter includes an inductor connected to the input voltage a switching arrangement for controlling the switching of the inductor current to an output load at the output voltage and a controller for controlling the switching arrangement to provide duty cycle control. The duty cycle control switching takes place when the inductor current reaches a peak current level which varies over time with a peak current level function. The peak current level function includes the combination of a target peak value derived from a target average inductor current and a slope compensation function which periodically varies with a period corresponding to the converter switching period.

20 Claims, 8 Drawing Sheets

(56) References Cited

U.S. PATENT DOCUMENTS

| | | | | |
|---|---|---|---|---|
| 2010/0253313 A1* | 10/2010 | Herzer | ................... | H02M 3/156 |
| | | | | 323/312 |
| 2012/0074917 A1* | 3/2012 | Chao | ..................... | H02M 3/155 |
| | | | | 323/282 |
| 2014/0132236 A1* | 5/2014 | Darmawaskita | ...... | H02M 3/156 |
| | | | | 323/283 |

OTHER PUBLICATIONS

Jiaying L. et al. "A Novel Piecewise Linear Slope Compensation Circuit in Peak Current Mode Control", IEEE Conference on Electron Devices and Solid-State Circuits, 4 pgs. (Dec. 2007).
Extended European Search Report for EP Patent Appln. No. 13157534.2 (Sep. 26, 2013).

* cited by examiner

BOOST CONVERTER

CROSS-REFERENCE TO RELATED APPLICATIONS

This application claims the priority under 35 U.S.C. §119 of European patent application no. 13157534.2, filed on Mar. 4, 2013, the contents of which are incorporated by reference herein.

This invention relates to boost converters. In particular, the invention relates to average current mode controlled boost converters.

In modern battery operated portable electronic equipment, such as smart phones, high efficiency boost converters are used for circuits that require a voltage above the battery voltage. High power efficiency is essential for long operating time before recharging is required.

In a boost converter usually a limitation on the peak current is required to prevent damage due to overload. An advantage of peak current mode control is that the maximum current in the inductor is controlled, and can be used to limit the input power in an easy way. For stability of the current loop at high duty cycles that occur at high voltage conversion ratios, slope compensation is required. Parabolic slope compensation gives the maximum speed of the current loop and ensures stability for all conversion ratios.

The disadvantage of a peak current mode controlled boost converter with parabolic slope compensation is that the maximum average inductor current depends on the amount of slope compensation, and is therefore strongly dependent on the boost voltage. The result is that the maximum output power depends strongly on the boost voltage.

FIG. 1 shows the basic boost converter circuit and is used to explain the principle of operation.

Many boost converters use an inductor connected between the battery and two switches Switch 1 and Switch 2 that connect the inductor either to ground or to the output capacitor.

Switch 1 is closed with switching frequency f (or period T) and duty cycle D and Switch 2 is closed when Switch 1 is open. The resulting current $I_L$ in the inductor L is a triangular shaped current with slopes determined by the battery voltage $V_{BAT}$ and the difference between battery and output voltage $V_{BAT}-V_{BST}$.

In the configuration of FIG. 1, the ratio between output voltage and battery voltage is determined by the duty cycle D used to operate the switches (D'=1−D):

$$V_{BST} = \frac{V_{BAT}}{1-D} = \frac{V_{BAT}}{D'}$$

The boost converter generally is designed for a (programmable) constant boost voltage with variable load current. Current mode control involves splitting the loop controlling the boost voltage in two parts:

(i) An inner loop, the current loop, acts as a controlled current source. The set point is a reference current generated by a voltage feedback block.

(ii) An outer loop, the voltage loop, adjusts the value of the controlled current source dependent on the error voltage at the output. In normal boost operation, a change in the load current will cause a voltage error. This voltage error is minimized by adjusting the value of the current controlled source.

This invention relates to the current loop used in a current mode controlled boost converter.

Many boost converters use peak current mode control within the current loop. In peak current mode control, the inductor current $I_L$ is compared to the peak current $I_{PEAK}$. In the beginning of each cycle, Switch 1 is closed and $I_L$ increases with slope $S_1$ (>0). As soon as $I_L$ is equal to the peak current $I_{PEAK}$, Switch 2 is closed (and Switch 1 is opened) the current decreases with slope $S_2$ (<0).

The current versus time can be seen in FIG. 2 for this peak current mode control. In steady state this gives the relation:

$$S_1 DT + S_2(1-D)T = 0$$

In FIG. 3 the propagation of an error $\Delta I_{L,0}$ in the current through the inductor at t=0 can be seen. $L_{L,AVG}$ represents the average current through the inductor.

FIG. 3 shows the current waveforms in peak current mode control and error propagation without slope compensation and $|S_2|<|S_1|$.

The duty cycle D of the period with 0<t<T is altered due to the error in the current $\Delta I_{L,O}$ with:

$$\Delta D = -\frac{\Delta I_{L,0}}{S_1}$$

The current error $\Delta I_{L,1}$ at t=T will then be equal to:

$$\Delta I_{L,1} = -\Delta D S_2 = \frac{\Delta I_{L,0} S_2}{S_1}$$

The amplification of the current error after one cycle is therefore equal to:

$$\frac{\Delta I_{L,1}}{\Delta I_{L,0}} = \frac{S_2}{S_1} = \frac{-D}{1-D}$$

After n cycles, the original error has amplified with a factor A(n):

$$\Delta I_{L,n} = \Delta I_{L,0} A(n) = \Delta I_{L,0} \left(\frac{S_2}{S_1}\right)^n$$

Since $S_2<0$ and $S_1>0$ the error has an alternating sign. Note that this system is not stable when $|S_2|>|S_1|$, so for D>50%.

FIG. 4 shows the current waveforms in peak current mode control and error propagation with $|S_2|>|S_1|$ and it shows instable behaviour leading to sub harmonic oscillations.

To control the damping and ensure stable behaviour for duty cycles above 50%, slope compensation is often used. With slope compensation, a periodic current $I_S$ with slope $S_3$ is subtracted from the peak current $I_{PEAK}$ as can be seen in FIG. 5, which shows current mode control with slope compensation and $|S_2|>|S_1|$. The duty cycle D of the first period 0<t<T will then be altered with:

$$\Delta D = -\frac{\Delta I_{L,0}}{S_1 - S_3}$$

The current error at t=T will now be equal to:

$$\Delta I_{L,1} = -\Delta D(S_2 - S_3) = \frac{\Delta I_{L,0}(S_2 - S_3)}{S_1 - S_3}$$

The amplification of the error is therefore equal to:

$$\frac{\Delta I_{L,1}}{\Delta I_{L,0}} = \frac{S_2 - S_3}{S_1 - S_3}$$

After n cycles, the original error $I_{L,0}$ has amplified with a factor A(n):

$$\Delta I_{L,n} = \Delta I_{L,0} A(n) = \Delta I_{L,0} \left(\frac{S_2 - S_3}{S_1 - S_3}\right)^n$$

To guarantee stability, $S_3$ must be chosen in such a way that the magnitude of the term between the brackets is below 1. Otherwise, the error explodes and sub harmonic oscillations will occur. Thus, it is required that:

$$|A| < 1 \text{ or } \left|\frac{S_2 - S_3}{S_1 - S_3}\right| < 1$$

Consider that only $S_1$ is positive, and $S_2$ and $S_3$ are negative (as in FIG. 5). The term between the brackets is can be both negative and positive dependent on $S_3$.

| | | | |
|---|---|---|---|
| $S_2 < S_3 < 0$ | $-1 < A < 0$ | the under damped case, | the error is alternating in sign. |
| $S_3 < S_2 < 0$ | $0 < A < 1$ | the over damped case, | the error keeps the same sign. |
| $S_3 = S_2 < 0$ | $A = 0$ | the critically damped case, | error is corrected in a single period. |

The situation with $S_3=S_2$ (so that A=0), gives the fastest possible transient response. This is the optimum slope control.

In the boost converter the current slopes $S_1$ and $S_2$ depend on the duty cycle D.

$$S_1(D) = \frac{V_{BAT}}{L} = (1-D)\frac{V_{BST}}{L} = D'\frac{V_{BST}}{L}$$

$$S_2(D) = \frac{V_{BAT} - V_{BST}}{L} = \frac{(1-D)V_{BST} - V_{BST}}{L} = -D\frac{V_{BST}}{L}$$

When a constant value is chosen for $S_3$, there is only one operating condition where the damping is critical (A=0). Even when |A|<1 for all operating conditions and stability is guaranteed, this means the error correction can take many periods resulting in a slow response. When optimal slope control with critical damping is required (with $S_3=S_2$) for all values of D, then $S_3$ must also depend on the duty cycle D:

$$S_3(D) = -D\frac{V_{BST}}{L}$$

So, at t=DT, the slope current derivative must be equal to $S_3$. Or, in the time domain:

$$S_3(t) = -\frac{tV_{BST}}{TL}$$

If the derivative of the slope current S3 depends linearly on the relative time in the period, the current itself depends on the square of the relative time, starting at 0 for t/T=0:

$$I_S(t) = \int_{x=0}^{x=t} -S_3(x)dx$$

$$= \frac{V_{BST}}{TL} \int_{x=0}^{x=t} x\,dx$$

$$= \frac{V_{BST}t^2}{2TL}$$

$$= \frac{V_{BST}T}{2L}\left(\frac{t}{T}\right)^2$$

$$= \frac{V_{BST}}{2fL}\left(\frac{t}{T}\right)^2$$

At t=DT the contribution of the slope compensation current $I_S$ is now equal to:

$$I_S(t=DT) = \frac{V_{BST}D^2}{2fL}$$

The amplitude of the ripple current (half the peak-peak value) is equal to:

$$I_R = \frac{DV_{BAT}}{2fL} = \frac{DD'V_{BST}}{2fL} = \frac{(D-D^2)V_{BST}}{2fL}$$

The average inductor current $I_{L,AVG}$ now is equal to:

$$I_{L,AVG} = I_{PEAK} - I_S - I_R$$

$$= I_{PEAK} - \frac{V_{BST}D^2}{2fL} - \frac{(D-D^2)V_{BST}}{2fL}$$

$$= I_{PEAK} - \frac{V_{BST} - V_{BAT}}{2fL}$$

For higher output voltage $V_{BST}$, a higher duty cycle D is required and the average inductor current $I_{L,AVG}$ reduces significantly as can be seen in FIG. 6. The higher the boost voltage, the more slope compensation is required and the higher the difference between $I_{PEAK}$ and $I_{L,AVG}$.

FIG. 6 shows the peak current mode control with optimal slope compensation for D=0.6 and FIG. 7 shows the peak current mode control with optimal slope compensation for D=0.4.

If the maximum power is limited, by imposing a limit on the peak current level $I_{PEAK}$, this means that the maximum output power is strongly dependent on the output voltage. Note that the peak level (labelled as Ip) is constant and the lowest point of the parabolic curve (labelled as Ip−Is) is voltage dependent.

According to the invention, there is provided an apparatus and method as defined in the claims.

In one aspect, the invention provides a boost converter for converting between an input voltage and an output voltage, comprising:

an inductor connected to the input voltage;

a switching arrangement for controlling the switching of the inductor current to an output load at the output voltage; and a controller for controlling the switching arrangement to provide duty cycle control, wherein the duty cycle control switching takes place when the inductor current reaches a peak current level which varies over time with a peak current level function, wherein the peak current level function comprises the combination of a target peak value derived from a target average inductor current value and a slope compensation function which periodically varies with a period corresponding to the converter switching period.

By controlling the peak current level (which defines the threshold at which duty cycle switching takes place) to result in a constant average inductor current, average current mode control can be provided to maintain a constant average current. The apparatus and method provide power limitation in a manner which is independent of the boost voltage.

The boost converter thus has average current mode control and slope compensation. The converter combines maximum speed of the current loop without the voltage dependent maximum output power that usually accompanies slope compensation.

The reference level function can comprise the combination of:

a target value for the average inductor current based on the error in the output voltage;

a compensation value for converting the target average inductor current value into a target peak inductor current value; and a parabolic slope compensation function.

In this way, the boost converter has average current mode control and parabolic slope compensation. The converter avoids the voltage dependent maximum output power that usually accompanies parabolic slope compensation.

Especially for high conversion ratio ranges this significantly simplifies the maximum power control.

A voltage feedback unit can be provided for deriving the target average inductor current and a limiter can limit the maximum target average inductor current. A compensation unit can be provided for deriving the compensation value from the input voltage and the target output voltage, for example the compensation value can comprise:

$$I_{COMP} = \frac{V_{BST} - V_{BAT}}{2fL}$$

wherein $V_{BST}$ is the output voltage, $V_{BAT}$ is the input value, L is the inductor inductance, and f is the converter switching frequency.

A slope compensation unit can be provided for deriving the parabolic slope compensation function from the target output voltage value. This function improves the stability of the converter by preventing oscillations for certain duty cycles.

In another aspect, the invention provides a method of controlling a boost converter, for converting between an input voltage and an output voltage, the method comprising controlling the switching of an inductor current to an output load at the output voltage using duty cycle control, wherein the duty cycle control comprising performing switching when the inductor current reaches a peak current level which varies over time with a peak current level function (Ip−Is), and wherein the method comprises deriving the peak current level function from a target peak value derived from a target average inductor current value and a slope compensation function which periodically varies with a period corresponding to the converter switching period.

The aspects of the invention above are based on the combination of average current control and slope compensation to enable power limitation which is independent of the boost voltage. The same problem can be solved by modifying a peak current control scheme. Thus, in accordance with another aspect of the invention, there is provided a boost converter for converting between an input voltage and an output voltage, comprising:

an inductor (10) connected to the input voltage;

a switching arrangement for controlling the switching of the inductor current to an output load at the output voltage; and a controller (for controlling the switching arrangement to provide duty cycle control, wherein the duty cycle control switching takes place when the inductor current reaches a peak current level which varies over time with a peak current level function, wherein the peak current level function comprises a target peak value which is limited in dependence on a maximum average inductor current and a slope compensation function (Is) which periodically varies with a period corresponding to the converter switching period.

An example of the invention will now be described in detail with reference to the accompanying drawings, in which.

The invention provides a boost converter which has control dependent on the average current so that the output power remains substantially constant, combined with slope control to improve stability. The converter also preferably implements parabolic slope compensation. The converter can then combine maximum speed of the current loop without the voltage dependent maximum output power that usually accompanies parabolic slope compensation. Especially for high conversion ratio ranges this significantly simplifies the maximum power control.

In particular, the invention provides an arrangement in which a voltage dependent current is added to the peak current level used in the peak current mode control, so that the maximum output power can be made independent of the boost voltage and battery voltage.

The control variable is no longer the actual peak current in the inductor, but the average current through the inductor.

For a boost converter with variable input and output voltage, the dependence of the maximum average current is not very convenient. It means that the power that can be delivered is strongly dependent on the output voltage. To compensate for the voltage dependence of the average inductor current in the peak current controlled boost converter, a voltage dependent compensation current $I_{COMP}$ can be added to the peak current level $I_{PEAK}$ in order to generate a corrected peak current level.

The average inductor current is given above as:

$$I_{L,AVG} = I_{PEAK} - \frac{V_{BST} - V_{BAT}}{2fL}$$

The difference between the $I_{L,AVG}$ and $I_{PEAK}$ is the compensation current $I_{COMP}$ that is required:

$$I_{L,AVG} = I_{PEAK} - I_{COMP}$$

$$I_{COMP} = \frac{V_{BST} - V_{BAT}}{2fL}$$

Figure 8:
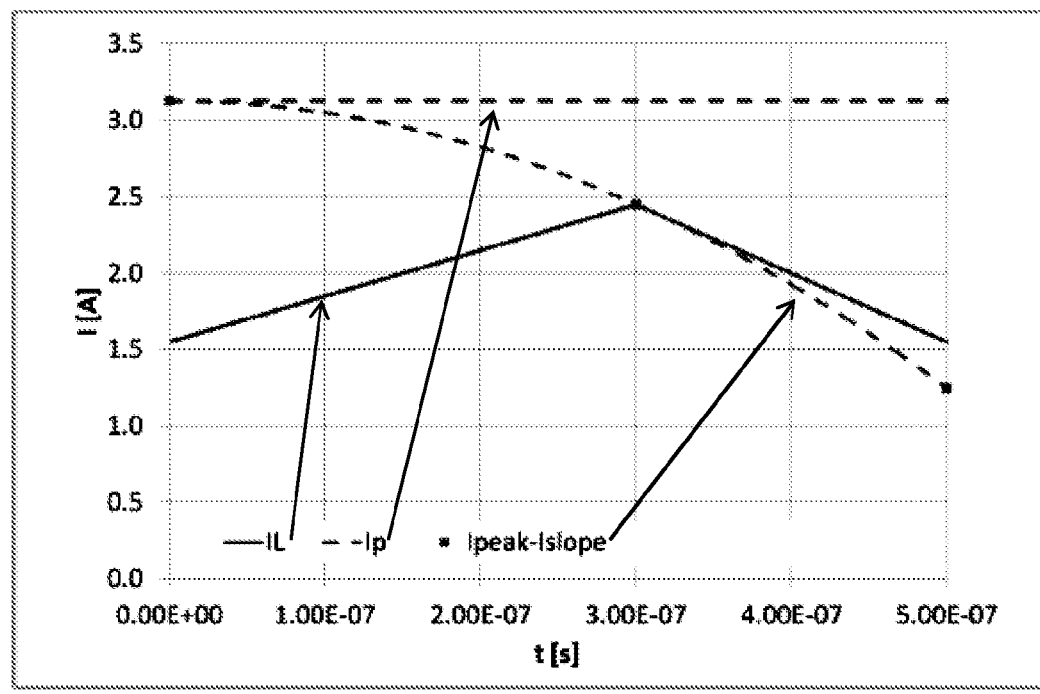
FIG. 8 shows a way to control the switching in the circuit of FIG. 1 using the method of the invention, for a first duty cycle.
Figure 9:
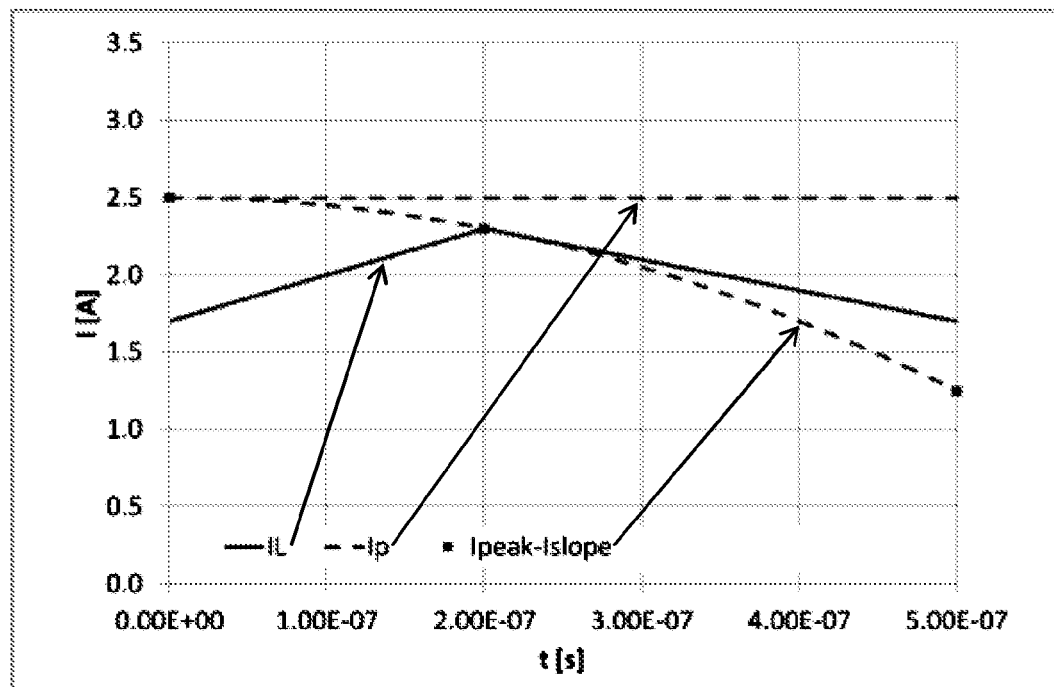
FIG. 9 shows a way to control the switching in the circuit of FIG. 1 using the method of the invention, for a second duty cycle.

FIG. 8 shows the average current mode control, $I_{L,AVG}$ set point at 2 A, with optimal slope compensation for D=0.6. FIG. 9 shows the average current mode control, $I_{L,AVG}$ set point at 2 A, with optimal slope compensation for D=0.4.

Now the average current through the inductor $I_{L,AVG}$ is the controlled variable (i.e. it is controlled to correspond to a target average current value) and remains constant when the boost or battery voltage change. In this way an equal amount of power can be delivered at all voltages. As can be seen from FIGS. 8 and 9, the $I_{PEAK}$ level (labelled as Ip) is no longer constant for different duty cycles. Instead, the lowest point of the parabolic curve (labelled as Ipeak−Islope) is a constant level in this approach.

To regulate the input current through the inductor and the output voltage a controller is used that receives the inductor current and the output voltage and generates the signals to close and open the switches.

Figure 10:
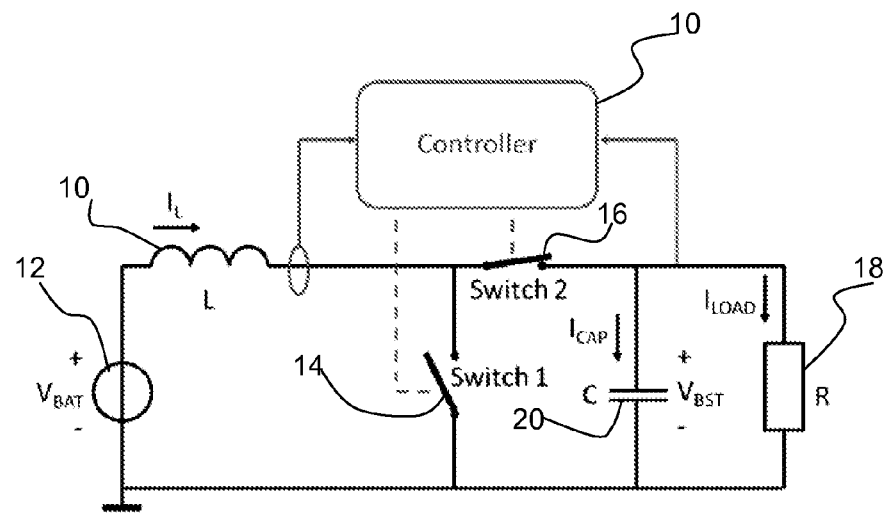
FIG. 10 shows the boost converter of the invention.

FIG. 10 shows a boost converter of the invention with a controller to regulate the inductor current and output voltage.

Figure 1:
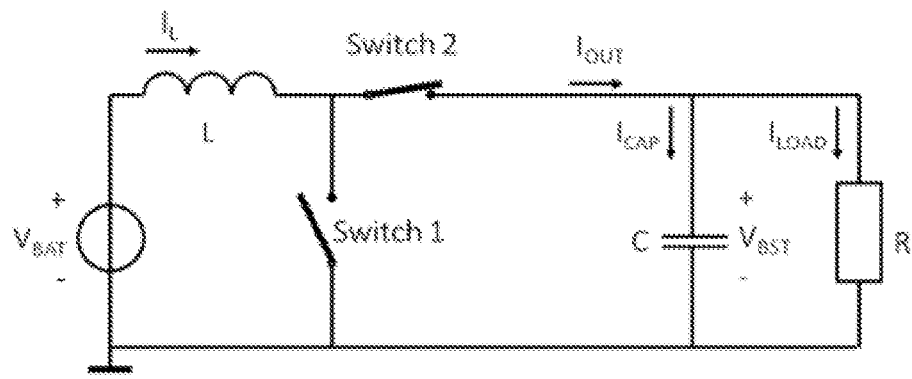
FIG. 1 shows a known boost converter circuit.
Figure 2:
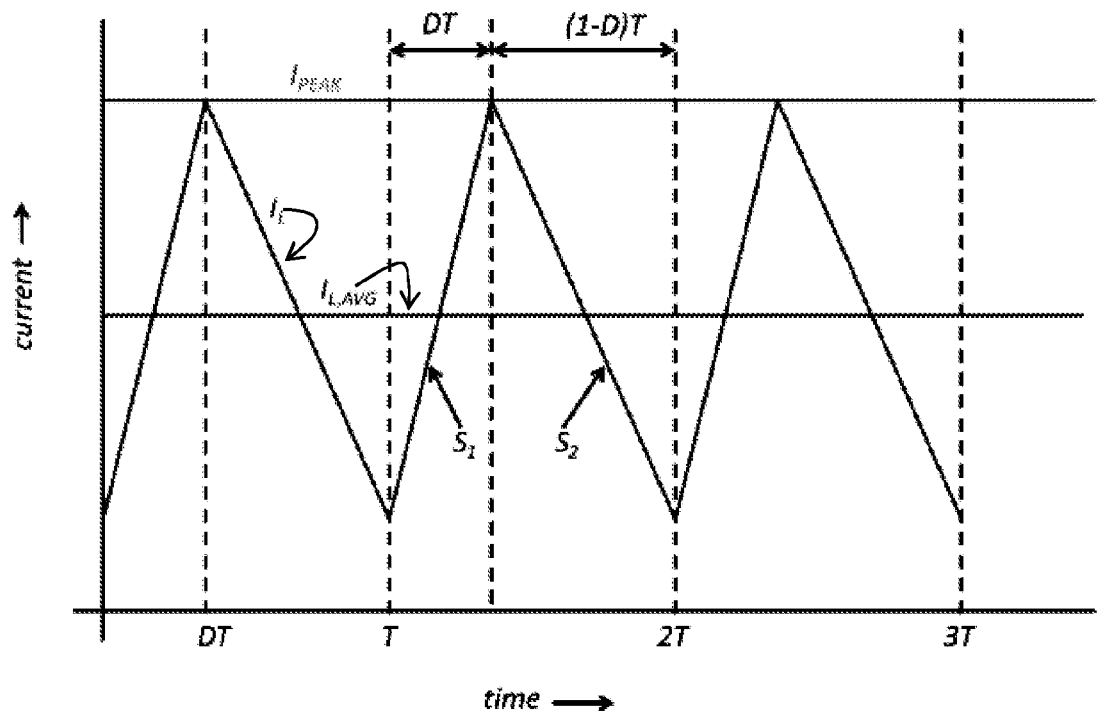
FIG. 2 shows a first known way to control the switching in the circuit of FIG. 1.
Figure 3:
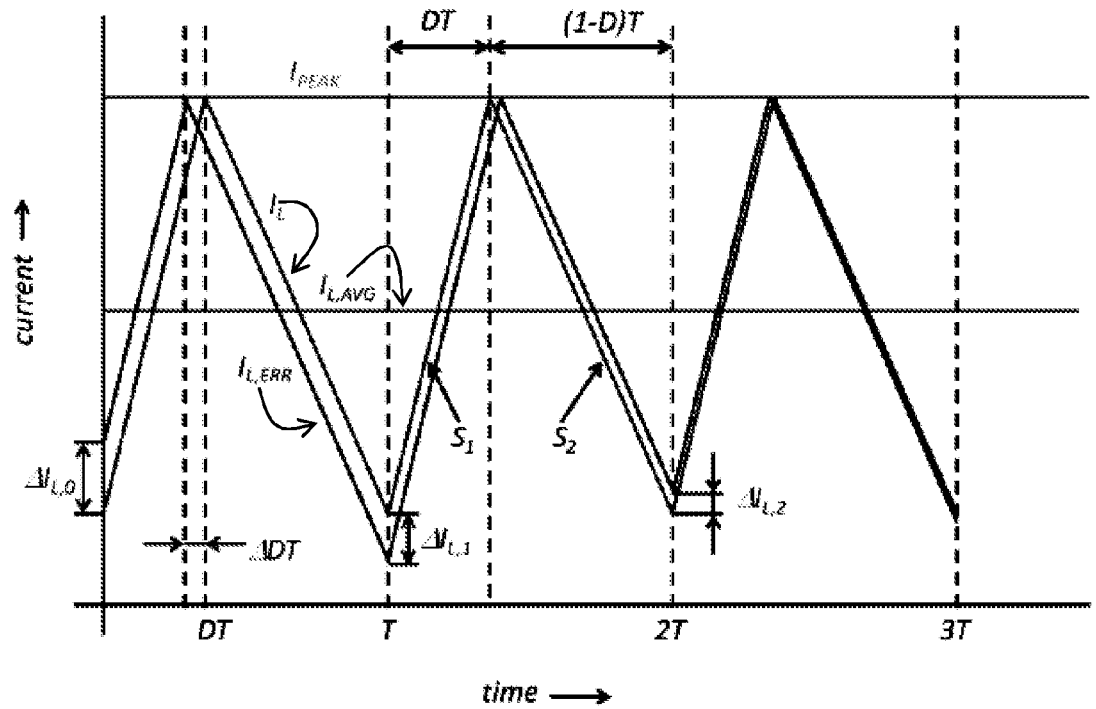
FIG. 3 shows how current errors affect the operation of the circuit.
Figure 4:
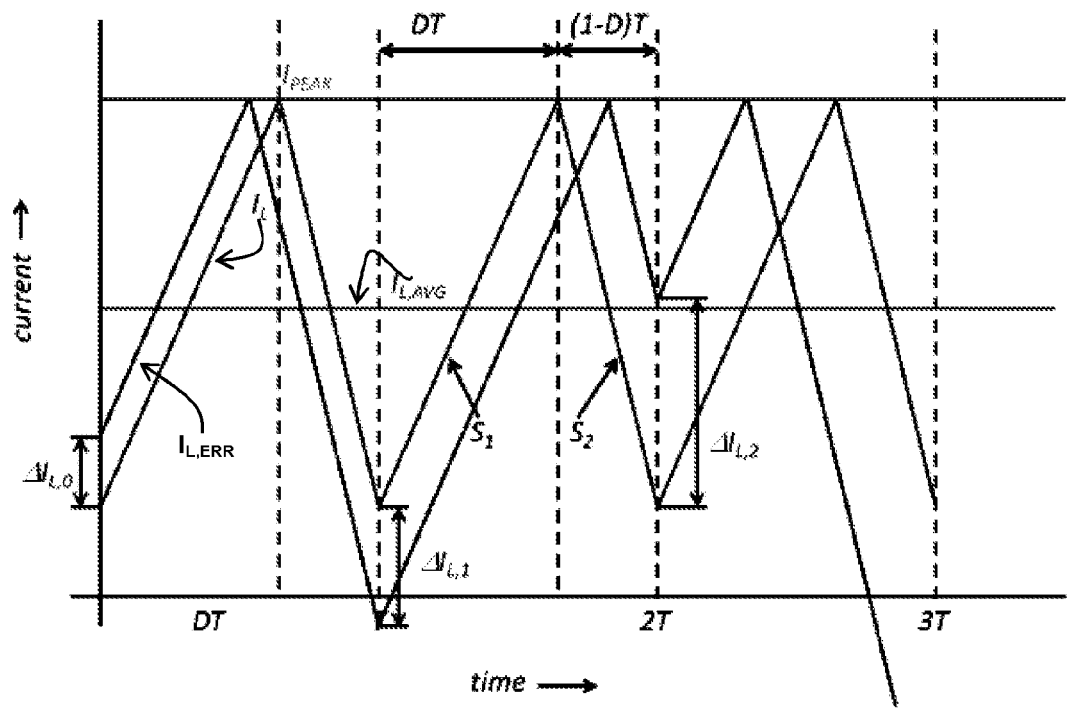
FIG. 4 shows how current errors can even cause instability.
Figure 5:
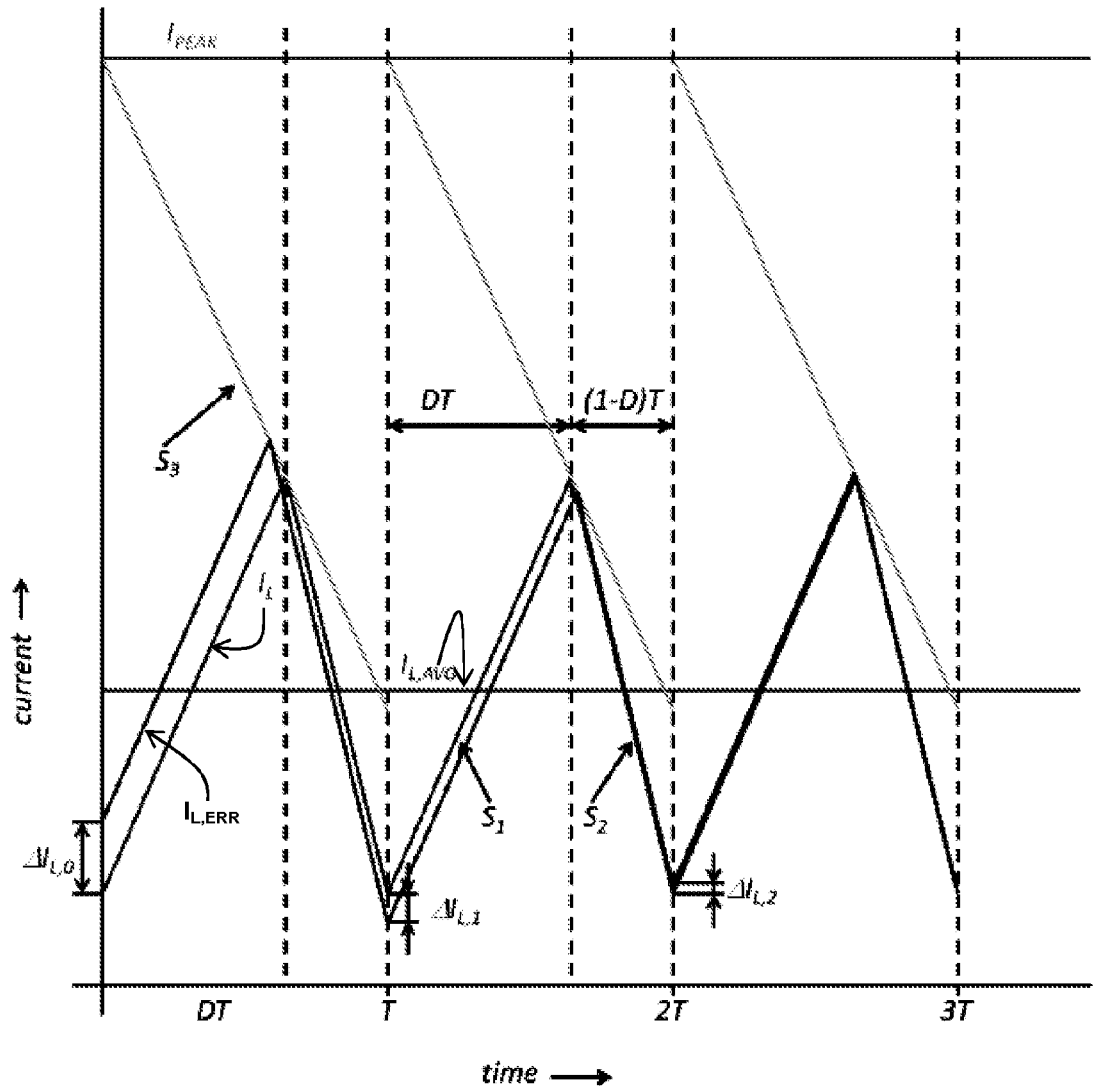
FIG. 5 shows a second known way to control the switching in the circuit of FIG. 1 using linear slope compensation.
Figure 6:
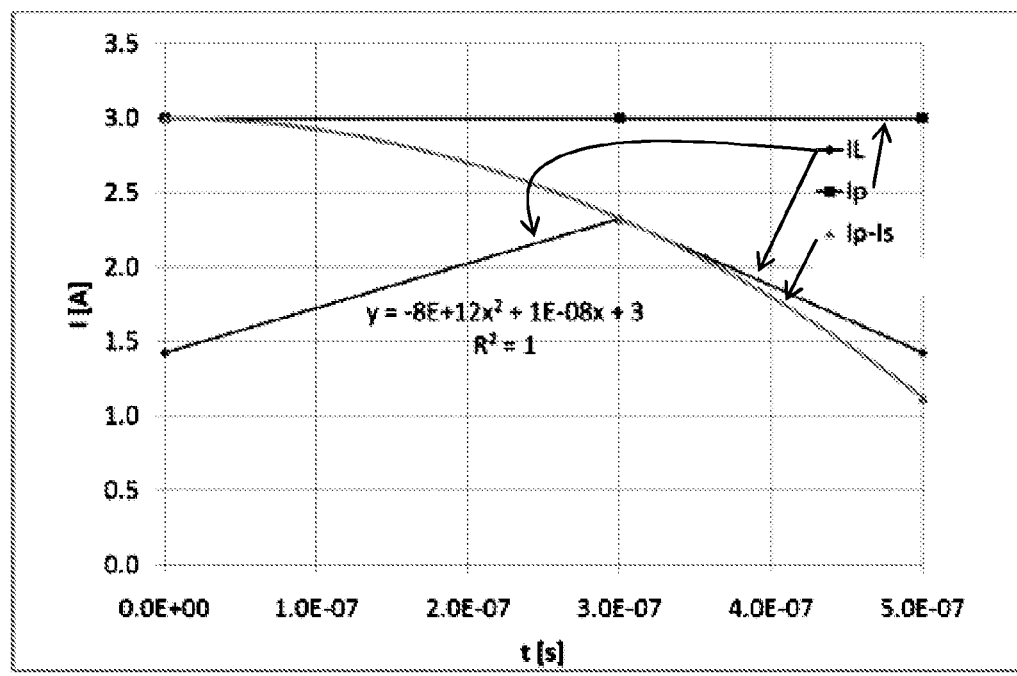
FIG. 6 shows a third known way to control the switching in the circuit of FIG. 1 using parabolic slope compensation, for a first duty cycle.
Figure 7:
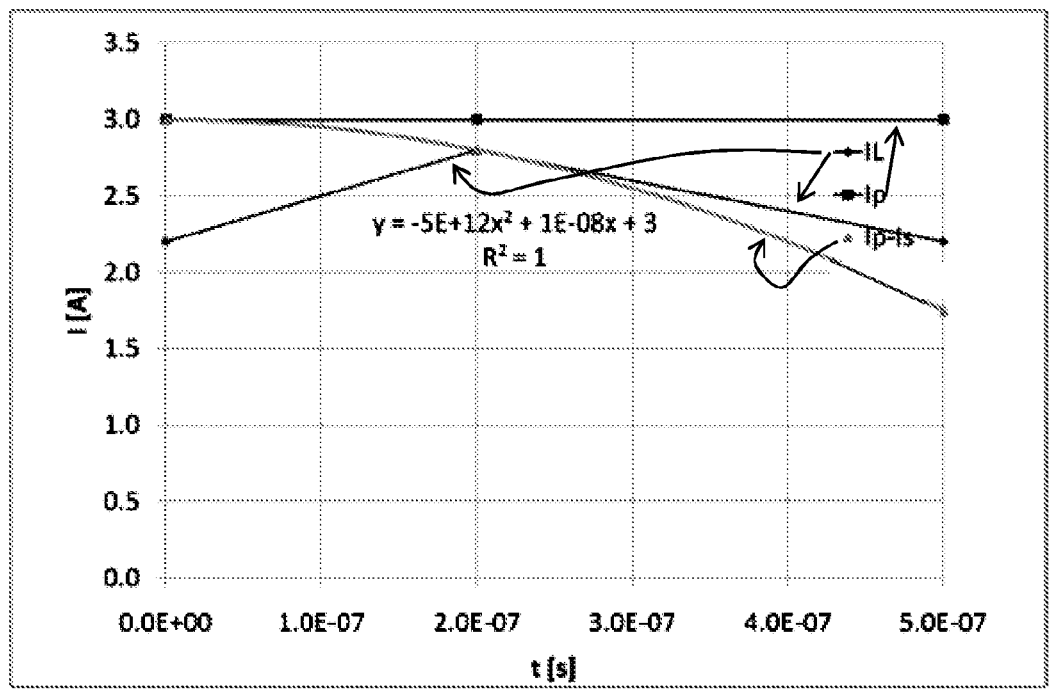
FIG. 7 shows the third known way to control the switching in the circuit of FIG. 1 using parabolic slope compensation, for a second duty cycle.

The circuit corresponds to FIG. 1, and this has an inductor 10 supplied by a battery 12, with a shunt switch 14 (Switch 1) to ground and a series switch 16 (Switch 2) from the other side of the inductor to the output load. The output load is shown as a load resistor 18 and a parallel capacitor 20 which stabilises the output voltage (i.e. it functions as a low pass filter). In addition to these components, which are common with FIG. 1, the circuit has a controller 10 which monitors the inductor current $I_L$, and controls the switches 14,16.

Figure 11:
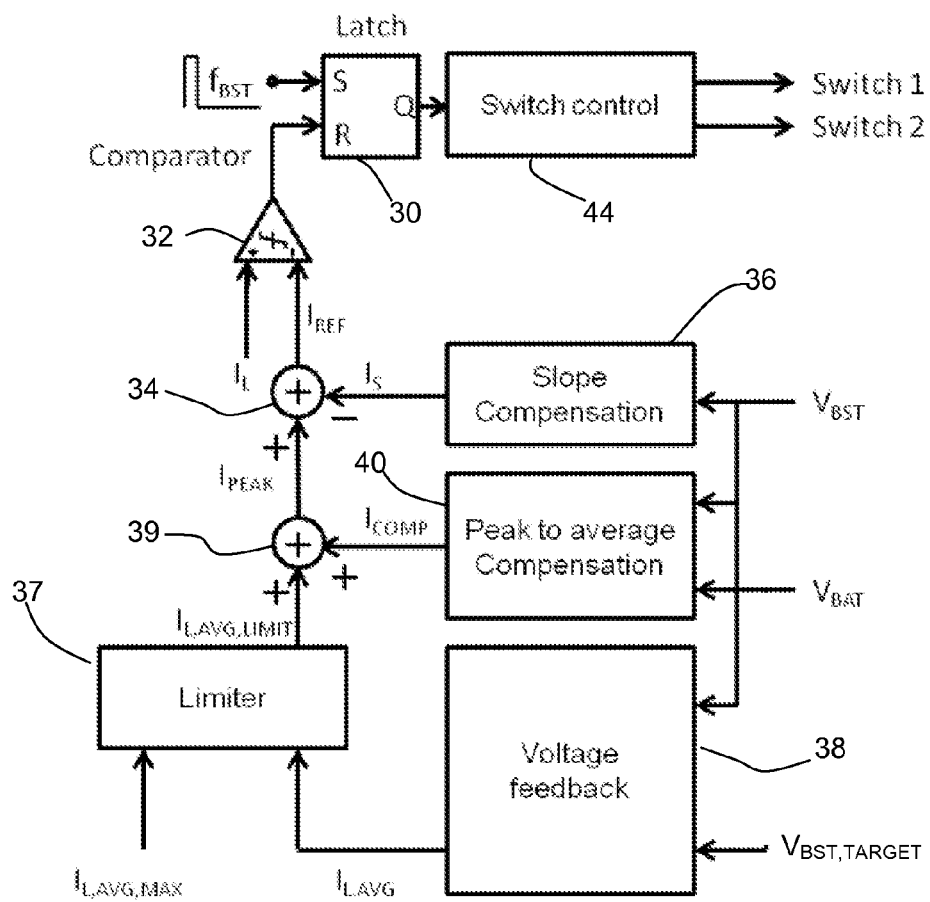
FIG. 11 shows the controller for the converter of FIG. 10 in more detail.

The details of the controller can be seen in FIG. 11.

The controller receives as inputs the monitored battery voltage $V_{BAT}$, the output voltage $V_{BST}$, the monitored inductor current $I_L$ and a setting of the maximum permitted average inductor current $I_{L,AVG,MAX}$. The value $V_{BST}$ can be a measured output voltage or it can be a target output voltage.

In this controller, a latch 30 (in this example an SR flip flop) is used that is set at a constant frequency $f_{BST}$ supplied to the S input. The reset R of the latch is generated with a comparator 32 and occurs when the actual current through the inductor $I_L$ exceeds a reference current $I_{REF}$.

When the output of the latch is equal to 1, switch 14 (Switch 1) is closed and switch 16 (Switch 2) is opened. The reference current $I_{REF}$ is equal to $I_{PEAK}-I_S$ where $I_S$ is the parabolic slope compensation current. This subtraction is implemented by subtractor 34, which receives the compensation current from a slope compensation calculation unit 36 and which uses the output voltage $V_{BST}$.

A limited target average current is obtained from a limiter 37 which receives a target average value $I_{L,AVG}$ from a voltage feedback unit 38. The feedback unit 38 derives the target average value based on an error feedback signal derived from the measured output voltage $V_{BST}$ and the target output voltage $V_{BST,TARGET}$.

The peak current level $I_{PEAK}$ is the sum of this limited target average current $I_{L,AVG,LIMIT}$ and the compensation current $I_{COMP}$.

This summation is implemented by adder 39. The compensation current $I_{COMP}$ is received from a peak to average compensation unit 40 which uses the battery voltage and the output voltage.

In the example of FIG. 11, the target peak value ($I_{PEAK}$) is derived from a target average inductor current, after adding the compensation current to the output of the voltage feedback unit.

Figure 12:
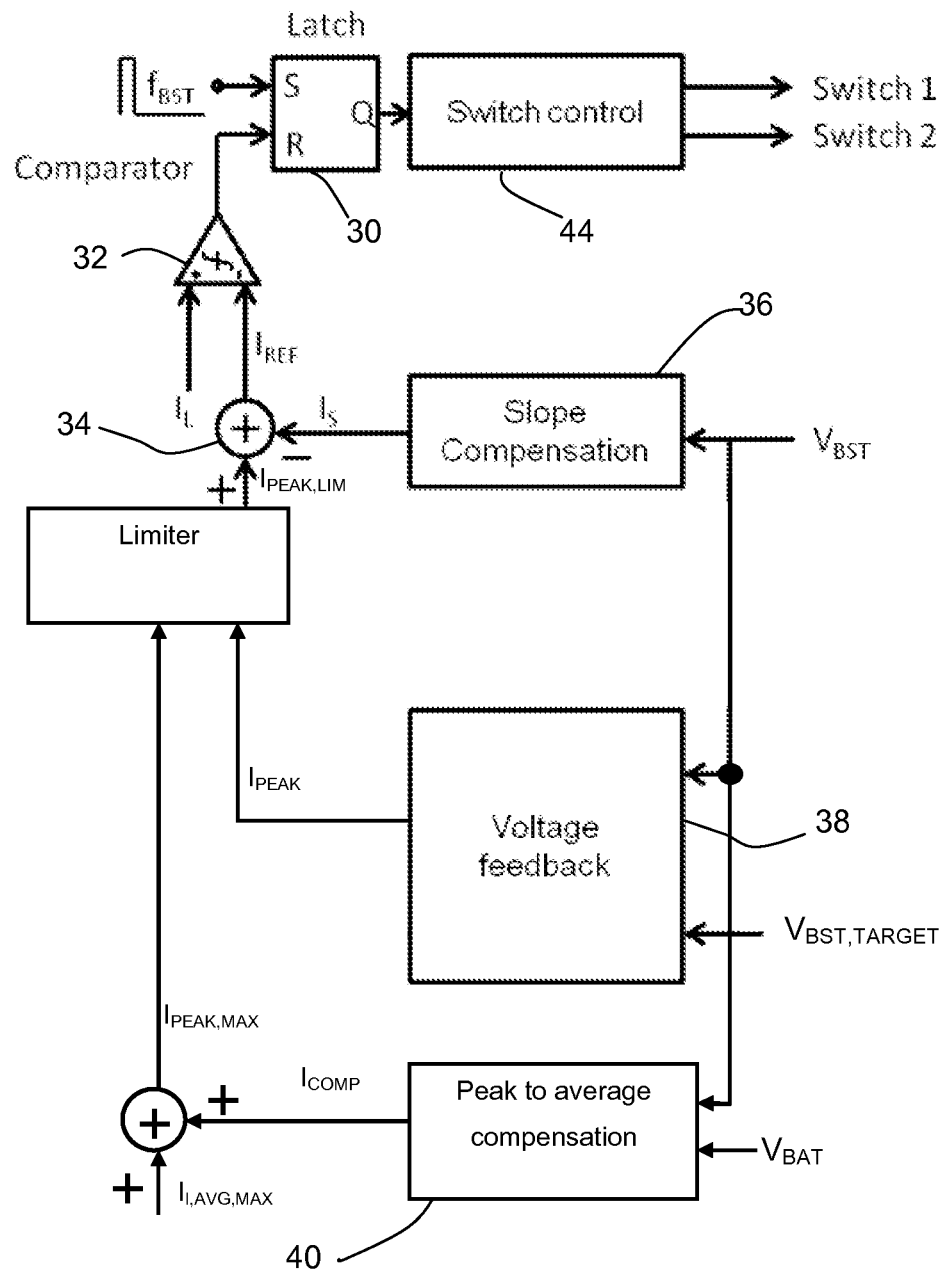
FIG. 12 shows a second example of controller for the converter of FIG. 10 in more detail.

In an alternative example the target peak value ($I_{PEAK}$) is limited based on a maximum average inductor current. This example thus comprises a modification to peak current control instead of a modification to average current control to achieve the same goal. This implementation is shown in FIG. 12, which uses the same reference numbers as FIG. 11 for the same components.

The compensation current is thus used only to adjust the maximum peak current level.

The peak current level (Ipeak,lim−Is) used as the switching reference again varies over time with a peak current level function. This time, the peak current level function comprises the standard peak current level as determined by the voltage feedback loop 38, but the peak current is first limited in dependence on a maximum average inductor current ($I_{L,AVG,MAX}$). The slope compensation is then applied to the limited peak current.

The average inductor current is determined once every clock cycle at the moment the inductor current reaches the peak current level. Thus, the system behaves as a sampled system with sample frequency equal to the switching frequency. The effect of a changing peak current level is equal to the effect of a sample and hold version of the change in peak current level. The sampled signals are considered constant during each sample and hold period, and indeed this applies to the peak current level as well as for the average current level.

This circuit provides peak current mode control (rather than average current mode control), but with a voltage-dependent maximum peak current level that is voltage dependent in such a way that the resulting maximum average current level is independent of the boost voltage. As long as the maximum peak is not reached so that the limited plays no role, this corresponds to normal peak current mode control. This arrangement translates an average inductor current limit to a peak current limit, so that the peak current is limited when needed in order to cap the average inductor current, and thereby reducing the dependency of the output power on the voltage.

Figure 13:
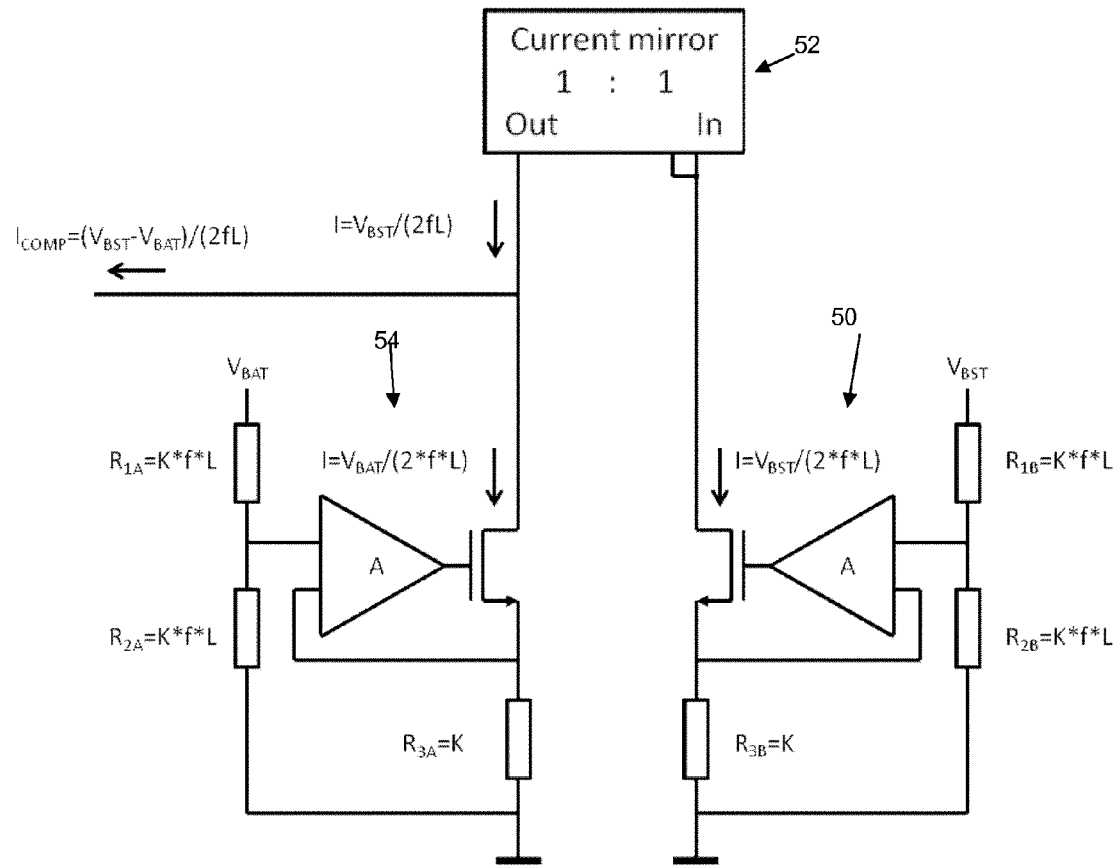
FIG. 13 shows a possible circuit for generating the compensation current.

FIG. 13 shows a circuit that can be used to generate the compensation current $I_{COMP}$. A first voltage to current converter 50 generates a input current dependent on the voltage $V_{BST}$, with value $V_{BST}/2$ fL. The current is mirrored by current mirror 52 and a second voltage to current converter 54 subtracts an amount $V_{BAT}/2$ fL derived from the battery voltage.

The limited controlled average current $I_{L,AVG, LIMIT}$ is derived from the set point for the average inductor current $I_{L,AVG}$ and the maximum average inductor current $I_{L,AVG,MAX}$ which limits the average current drawn from the battery.

The current value $I_{L,AVG}$ is an internal control signal in the feedback loop for controlling the output voltage $V_{BST}$. The signal level of $I_{L,AVG}$ is generated by the voltage feedback block and is based on the error voltage at the output capacitor. The voltage feedback block implements a transfer function that continuously adjusts the signal level of $L_{L,AVG}$ in order to minimize the error voltage at the output of the converter. Any variation in load current or battery voltage will require an adjustment of $I_{L,AVG}$. Thus, typically the load current is not known, so that a calculation cannot be made to determine the required $I_{L,AVG}$. Instead, the control loop will adjust $I_{L,AVG}$ until the voltage error at the output is reduced to the minimum (determined by the loop gain of whole system). This is the basic operation of a boost converter with current mode control.

The output of the latch 30 is provided to a switch control unit 44 for controlling the switches.

The operation of the circuit is thus:

(i) In each switching period, generate a new target value for $I_{L,AVG}$ based on error in the output voltage (target value $V_{BST,TARGET}$ minus actual value $V_{BST}$);

(ii) Limit this target value if required to limit the maximum input power. When limiting occurs, the current through the inductor is no longer sufficient to maintain the output voltage at the required level (the set point). The maximum output power is reached at that point. In this way, the output voltage at which this power limit is reached does not depend on the boost voltage;

(iii) Add a compensation value to the target $I_{L,AVG}$ value. This compensation current serves to convert what was a target average inductor current value into a target peak inductor current value;

(iv) Apply (known) parabolic slope compensation by subtracting a parabolic current function from the target peak inductor current value to derive a reference current; and (v) Use the reference current to provide the threshold for the measured inductor current at which switching takes place.

This approach thus essentially modifies the peak current target by applying a compensation factor which is dependent on the input and output voltages, such that the peak becomes voltage-dependent. This voltage dependency in particular means that the reference current profile starts at a variable (voltage-dependent) initial peak value and parabolically decays during the switching period.

For a given output power, different target voltages will give rise to different initial peak current, which in turn will result in a different point at which the reference current is reached, and therefore a different duty cycle. However, the average inductor current remains the same. Consequently, limiting the average current limits the output power to the same level for different target voltages.

FIGS. 11 and 12 show the different signals separately. However, in practice, a computer program can be used to receive the input signals and derive the output for provision to the latch. Thus, the different units in practice may not be distinct as shown.

The current mode control can be used in any current mode controlled DC-DC converter. By way of example, the invention is of interest for boosted class-D audio amplifiers.

Various modifications will be apparent to those skilled in the art.

The invention claimed is:

1. A boost converter for converting between an input voltage and an output voltage on an output load, comprising:
   an inductor connected to the input voltage;
   a switching arrangement, including a first switch between the inductor and the output load and for controlling switching of current from the inductor to the output load; and
   a controller, including circuitry, for controlling a duty cycle of the switching, wherein the duty cycle is controlled in response to the current reaching a peak current level which varies over time with a peak current level function that includes a parabolic slope compensation function, wherein the compensation value is derived as a function of the output voltage offset by an input value, and of both inductor inductance and converter switching frequency, wherein the peak current level function comprises a combination of a target peak value derived from a target average inductor current and a slope compensation function which periodically varies with a period corresponding to a converter switching period.

2. A converter as claimed in claim 1, wherein the peak current level function comprises the combination of:
   a target value for the average inductor current based on an error in the output voltage;
   a compensation value for converting the target average inductor current value into the target peak value by adding the compensation value to the target value, wherein
   the compensation value is derived from the input voltage and the output voltage.

3. A converter as claimed in claim 2, comprising a voltage feedback unit, including circuitry, for deriving the target average inductor current and a limiter for limiting a maximum target average inductor current, wherein the compensation value is proportional to the converter switching period and is derived from the input voltage, the output voltage, the inductor inductance, and the switching arrangement switching frequency.

4. A converter as claimed in claim 2, comprising a compensation unit, including circuitry, for deriving the compensation value from the input voltage and a target output voltage.

5. A converter as claimed in claim 4, wherein the compensation value comprises:

$$I_{COMP} = \frac{V_{BST} - V_{BAT}}{2fL}$$

wherein $V_{BST}$ is the output voltage, $V_{BAT}$ is the input value, L is the inductor inductance, and f is the converter switching frequency.

6. A converter as claimed in claim 2, comprising a slope compensation unit, including circuitry, for deriving the slope compensation function from a target output voltage value.

7. An audio amplifier comprising a boost converter as claimed in claim 1.

8. A converter as claimed in claim 1, wherein the switching arrangement includes a second switch connected between the inductor and ground and wherein the duty cycle is controlled by providing signals to the switching arrangement to selectively switch the current from the inductor between the output load and ground using the first and the second switches, respectively.

9. A method of controlling a boost converter, for converting between an input voltage and an output voltage on an output load, the method comprising:
controlling a duty cycle of a switching arrangement, the switching arrangement including a first switch between an inductor and the output load, wherein the inductor is connected to the input voltage, and
wherein the duty cycle controls a current provided from the inductor to the output load, wherein the duty cycle is controlled by performing the switching in response to the current reaching a peak current level which varies over time with a peak current level function, and
wherein the method further comprises deriving the peak current level function from a target peak value which is derived from a target average inductor current and a slope compensation function which periodically varies with a period corresponding to a converter switching period, and wherein the peak current level function includes a parabolic slope compensation function, wherein the compensation value is derived as a function of the output voltage offset by an input value, and of both inductor inductance and converter switching frequency.

10. A method as claimed in claim 9, wherein deriving the peak current level function comprises:
setting a target value for the average inductor current based on an error in the output voltage;
converting the target average inductor current value into a target peak inductor current value using the input voltage, a target output voltage, the inductor inductance, and the switching arrangement switching frequency; and
applying the parabolic slope compensation function to the target peak inductor current value, wherein converting the target average inductor current value into a target peak inductor current value includes adding a compensation value to the target average inductor current value that is based on the input voltage and the target output voltage, and wherein converting the target average inductor current value into a target peak inductor current value comprises adding a compensation value which is a function of output voltage Vbst, input value Vbat, inductor inductance, and converter switching frequency.

11. A method as claimed in claim 10, comprising limiting the maximum target average inductor current.

12. A method as claimed in claim 10, wherein converting the target average inductor current value into a target peak inductor current value includes adding a compensation value to the target average inductor current value that is based on the input voltage and the target output voltage.

13. A method as claimed in claim 12, wherein converting the target average inductor current value into a target peak inductor current value comprises adding a compensation value which comprises:

$$I_{COMP} = \frac{V_{BST} - V_{BAT}}{2fL},$$

wherein $V_{BST}$ is the output voltage, $V_{BAT}$ is the input value, L is the inductor inductance, and f is the converter switching frequency.

14. A method as claimed in claim 9, wherein the slope compensation function is derived from a target output voltage value.

15. A boost converter for converting between an input voltage and an output voltage on an output load, comprising:
an inductor connected to the input voltage;
a switching arrangement, including a first switch between the inductor and the output load and for controlling switching of current from the inductor to the output load; and
a controller, including circuitry, for controlling a duty cycle of the switching,
wherein the duty cycle is controlled in response to the current reaching a peak current level which varies over time with a peak current level function that includes a parabolic slope compensation function, wherein the compensation value is derived as a function of the output voltage offset by an input value, and of both inductor inductance and converter switching frequency, wherein the peak current level function comprises a target peak value which is limited in dependence on a maximum average inductor current and a slope compensation function which periodically varies with a period corresponding to a converter switching period.

16. A converter as claimed in claim 15, wherein the switching arrangement includes a second switch between the inductor and ground and wherein the duty cycle is controlled by providing signals to the switching arrangement to selectively switch the current from the inductor to the output load using the first switch and to ground using the second switch.

17. A converter as claimed in claim 15, wherein the controller is configured and arranged to control the duty cycle of the switching using inputs of:
the input voltage;
a measured or target output voltage;
the current from the inductor; and
a setting of the maximum average inductor current.

18. A converter as claimed in claim 15, wherein the controller is configured and arranged to control the duty cycle of the switching by adding a compensation value to an average inductor current to define the target peak value using the input voltage, the output voltage, the current from the inductor, and the converter switching frequency.

19. A method of controlling a boost converter, for converting between an input voltage and an output voltage on an output load, the method comprising:
controlling a duty cycle of a switching arrangement, the switching arrangement including a first switch between an inductor and the output load, wherein the inductor is connected to the input voltage, and wherein the duty cycle is controlled by the switching arrangement changing a current provided from the inductor to the output load,
wherein the duty cycle is further controlled by performing switching in response to the current reaching a peak current level which varies over time with a peak current level function, wherein the peak current level function comprises a target peak value which is limited in dependence on a maximum average inductor current and a parabolic slope compensation function which periodically varies with a period corresponding to a converter switching period, and which is derived as a function of the output voltage offset by an input value, and of both inductor inductance and converter switching frequency.

20. A method as claimed in claim 19, wherein controlling the duty cycle of the switching arrangement further includes adding a compensation value to an average inductor current to define the target peak value using the input voltage, the output voltage or target output voltage, the current from the inductor, and the converter switching frequency.

* * * * *